United States Patent
He et al.

(10) Patent No.: US 10,775,874 B2
(45) Date of Patent: Sep. 15, 2020

(54) MULTI-TIERED LOW POWER STATES

(71) Applicants: Advanced Micro Devices, Inc., Santa Clara, CA (US); ATI Technologies ULC, Markham (CA)

(72) Inventors: Xiaojie He, Austin, TX (US); Alexander J. Branover, Boxborough, MA (US); Mihir Shaileshbhai Doctor, Santa Clara, CA (US); Evgeny Mintz, Markham (CA); Fei Fei, Shanghai (CN); Ming So, Santa Clara, CA (US); Felix Yat-Sum Ho, Markham (CA); Biao Zhou, Shanghai (CN)

(73) Assignees: ADVANCED MICRO DEVICES, INC., Santa Clara, CA (US); ATI TECHNOLOGIES ULC, Markham, Ontario (CA)

(*) Notice: Subject to any disclaimer, the term of this patent is extended or adjusted under 35 U.S.C. 154(b) by 103 days.

(21) Appl. No.: 16/210,985

(22) Filed: Dec. 5, 2018

(65) Prior Publication Data
US 2020/0166985 A1    May 28, 2020

(30) Foreign Application Priority Data
Nov. 26, 2018    (CN) .......................... 2018 1 1416703

(51) Int. Cl.
*G06F 1/3293* (2019.01)
*G06F 1/324* (2019.01)
*H01L 23/31* (2006.01)

(52) U.S. Cl.
CPC ............ *G06F 1/3293* (2013.01); *G06F 1/324* (2013.01); *H01L 23/3114* (2013.01)

(58) Field of Classification Search
CPC combination set(s) only.
See application file for complete search history.

(56) References Cited

U.S. PATENT DOCUMENTS 6,499,102 B1 * 12/2002 Ewertz .................. G06F 1/3203
                                                            713/1
2006/0156045 A1 * 7/2006 Galles ................... G06F 1/3296
                                                            713/300

(Continued)

OTHER PUBLICATIONS

Microsoft, "System Power States," Windows Development Center, https://docs.microsoft.com/en-us/windows/desktop/power/system-power-states, May 30, 2018 (Retrieved on Dec. 3, 2018).

(Continued)

*Primary Examiner* — Raymond N Phan
(74) *Attorney, Agent, or Firm* — Volpe and Koenig, P.C.

(57) ABSTRACT

A computer processing device transitions among a plurality of power management states and at least one power management sub-state. From a first state, it is determined whether an entry condition for a third state is satisfied. If the entry condition for the third state is satisfied, the third state is entered. If the entry condition for the third state is not satisfied, it is determined whether an entry condition for the first sub-state is satisfied. If the entry condition for the first sub-state is determined to be satisfied, the first sub-state is entered, a first sub-state residency timer is started, and after expiry of the first sub-state residency timer, the first sub-state is exited, the first state is re-entered, and it is re-determined whether the entry condition for the third state is satisfied.

20 Claims, 8 Drawing Sheets

(56) References Cited

U.S. PATENT DOCUMENTS

| | | | | |
|---|---|---|---|---|
| 2008/0282101 A1* | 11/2008 | Adams | ............... | G06F 1/3237 |
| | | | | 713/322 |
| 2012/0311361 A1* | 12/2012 | Locker | ............... | G06F 1/3234 |
| | | | | 713/323 |
| 2014/0173306 A1* | 6/2014 | Cooper | ............... | G06F 1/3221 |
| | | | | 713/320 |
| 2014/0258754 A1* | 9/2014 | Akenine-Moller | ... | G06F 1/3234 |
| | | | | 713/323 |
| 2015/0370311 A1* | 12/2015 | Eckert | ............... | G06F 1/3228 |
| | | | | 713/323 |

OTHER PUBLICATIONS

JEDEC Solid State Technology Association, "JEDEC Standard—Low Power Double Data Rate 4 (LPDDR4)", JESD209-4, Aug. 2014.

Tektronix, "LPDDR4 Interface Electrical Validation", Proceedings of Memcon 2014, http://www.memcon.com/pdfs/proceedings2014/mob104.pdf, 2014 (Retrieved on Dec. 3, 2018).

\* cited by examiner

| | Entry | Exit | | | | | | | | | |
|---|---|---|---|---|---|---|---|---|---|---|---|
| | Entry Condition | LAPIC Timers | FCH Timers | USB | GPIO (S5) | GPIO (S0) | PCIe | On-die WIFI | ACP (WOV) | Power Button | Exit Time |
| S0i1 (Short Idle) | Idle; Display On | Yes | Yes | Yes | Yes | Yes | Yes | Yes | Yes | Yes | $T_{EXIT\_S0i1}$ |
| S0i2.0 (Long Idle) | Long Idle; Display Off; | No | Yes | Yes | Yes | Yes/No | Yes | Yes | Yes | Yes | $T_{EXIT\_S0i2.0}$ |
| S0i2.1 (Long Idle, PCIe L1 Substrate) | Display Off and PCIe L1 Substrate (L1.1, L1.2) | No | Yes | Yes | Yes | Yes/No | Yes | Yes | Yes | Yes | $T_{EXIT\_S0i2.1}$ |
| S0i3 - MS (Modern Soft Off) | ACP16/PEP Hint | No | Yes | Yes | Yes | No | No | Yes | Yes | Yes | $T_{EXIT\_S0i3}$ |
| S4/S5 (Hibernate, Soft Off) | OS | No | Yes | No | No | No | No | No | No | Yes | $T_{EXIT\_S4'}$ $T_{EXIT\_S5}$ |

FIG. 8

MULTI-TIERED LOW POWER STATES

CROSS REFERENCE TO RELATED APPLICATION

This application claims priority to Chinese Patent Application No. 201811416703.7, filed Nov. 26, 2018, the entire contents of which is hereby incorporated by reference as if fully set forth herein.

BACKGROUND

Modern computer systems can typically support several power management states. The working system state generally describes a state where the system is fully usable and fully energized. Under some conditions, such as if some or all of the system components are not being used, power is reduced for some or all of the components by entering a lower power system state from the working state.

BRIEF DESCRIPTION OF THE DRAWINGS

A more detailed understanding can be had from the following description, given by way of example in conjunction with the accompanying drawings wherein.

DETAILED DESCRIPTION

A computer processing device includes a processor coupled to a memory. The processor includes circuitry to transition among a plurality of power management states and at least one power management sub-state. The plurality of power management states includes a first power management state, a second power management state, and a third power management state. The second power management state includes a first sub-state. The processor also includes circuitry to, from the first power management state, determine whether an entry condition for the third power management state is satisfied. If the entry condition for the third power management state is satisfied, the circuitry enters the third power management state. If the entry condition for the third power management state is not satisfied, the circuitry determines whether an entry condition for the first sub-state is satisfied. If the entry condition for the first sub-state is determined to be satisfied, the circuitry enters the first sub-state, starts a first sub-state residency timer, and after expiry of the first sub-state residency timer, exits the first sub-state, reenters the first power management state, and re-determines whether the entry condition for the third power management state is satisfied.

A method for power management in a computer processing device includes transitioning among a plurality of power management states and at least one power management sub-state. The plurality of power management states includes a first power management state, a second power management state, and a third power management state. The second power management state includes first sub-state. From the first power management state, it is determined whether an entry condition for the third power management state is satisfied. If the entry condition for the third power management state is satisfied, the third power management state is entered. If the entry condition for the third power management state is not satisfied, it is determined whether an entry condition for the first sub-state is satisfied. If the entry condition for the first sub-state is determined to be satisfied, the first sub-state is entered, a first sub-state residency timer is started, and after expiry of the first sub-state residency timer, the first sub-state is exited, the first power management state is re-entered, and it is re-determined whether the entry condition for the third power management state is satisfied.

Figure 1:
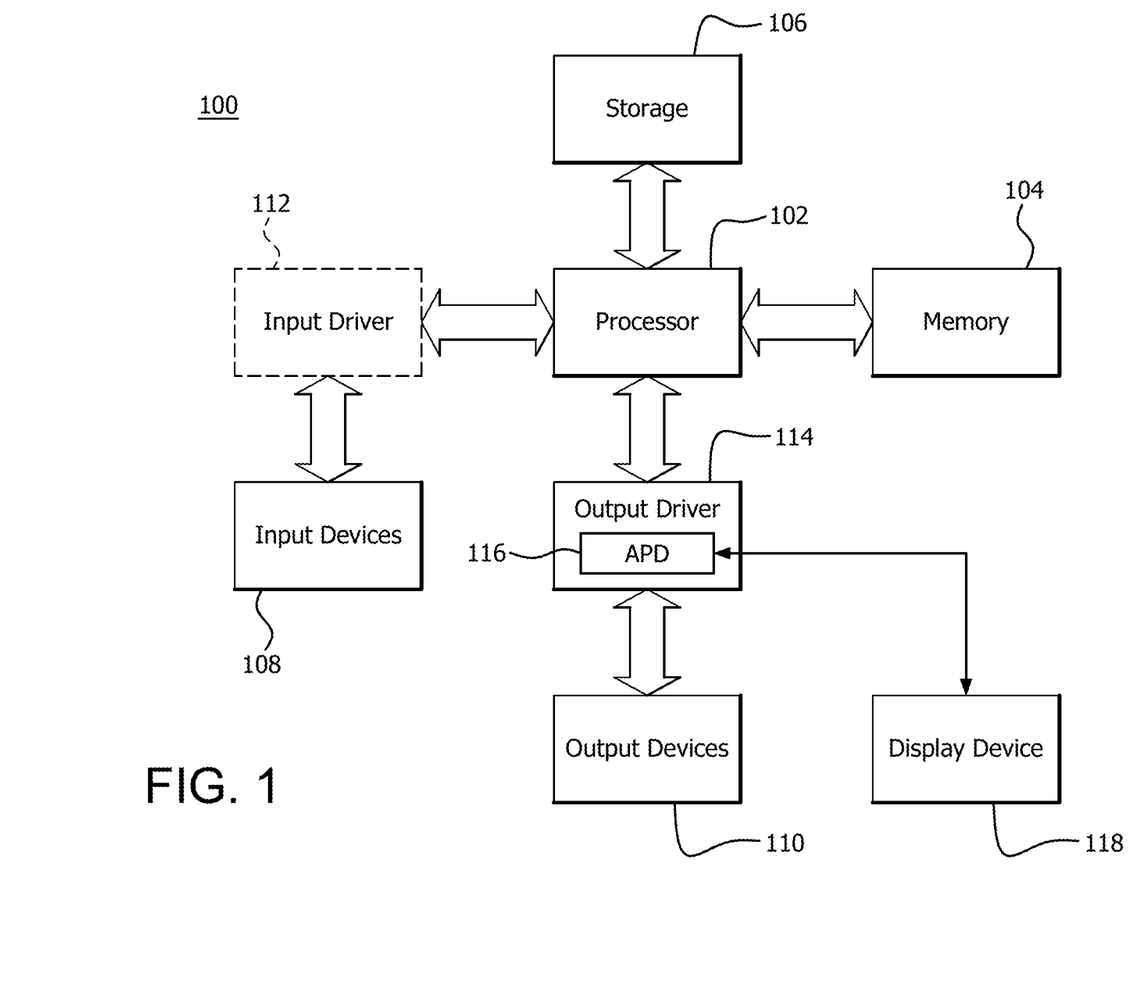
FIG. 1 is a block diagram of an example device in which one or more features of the disclosure can be implemented.

FIG. 1 is a block diagram of an example device 100 in which one or more features of the disclosure can be implemented. The device 100 can include, for example, a computer, a gaming device, a handheld device, a set-top box, a television, a mobile phone, or a tablet computer. The device 100 includes a processor 102, a memory 104, a storage 106, one or more input devices 108, and one or more output devices 110. The device 100 can also optionally include an input driver 112 and an output driver 114. It is understood that the device 100 can include additional components not shown in FIG. 1.

In various alternatives, the processor 102 includes a central processing unit (CPU), a graphics processing unit (GPU), a CPU and GPU located on the same die or on multiple dies (e.g., using a multi-chip-module (MCM)), or one or more processor cores, wherein each processor core can be a CPU or a GPU. In various alternatives, the memory 104 is located on the same die as the processor 102, or is located separately from the processor 102. The memory 104 includes a volatile or non-volatile memory, for example, random access memory (RAM), dynamic RAM, or a cache.

The storage 106 includes a fixed or removable storage, for example, a hard disk drive, a solid state drive, an optical disk, or a flash drive. The input devices 108 include, without limitation, a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include, without limitation, a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present. The output driver 114 includes an accelerated processing device ("APD") 116 which is coupled to a display device 118. The APD accepts compute commands and graphics rendering commands from processor 102, processes those compute and graphics rendering commands, and provides pixel output to display device 118 for display. As described in further detail below, the APD 116 includes one or more parallel processing units that perform computations in accordance with a single-instruction-multiple-data ("SIMD") paradigm. Thus, although various functionality is described herein as being performed by or in conjunction with the APD 116, in various alternatives, the functionality described as being performed by the APD 116 is additionally or alternatively performed by other computing devices having similar capabilities that are not driven by a host processor (e.g., processor 102) and provides graphical output to a display device 118. For example, it is contemplated that any processing system that performs processing tasks in accordance with a SIMD paradigm may perform the functionality described herein. Alternatively, it is contemplated that computing systems that do not perform processing tasks in accordance with a SIMD paradigm performs the functionality described herein.

Figure 2:
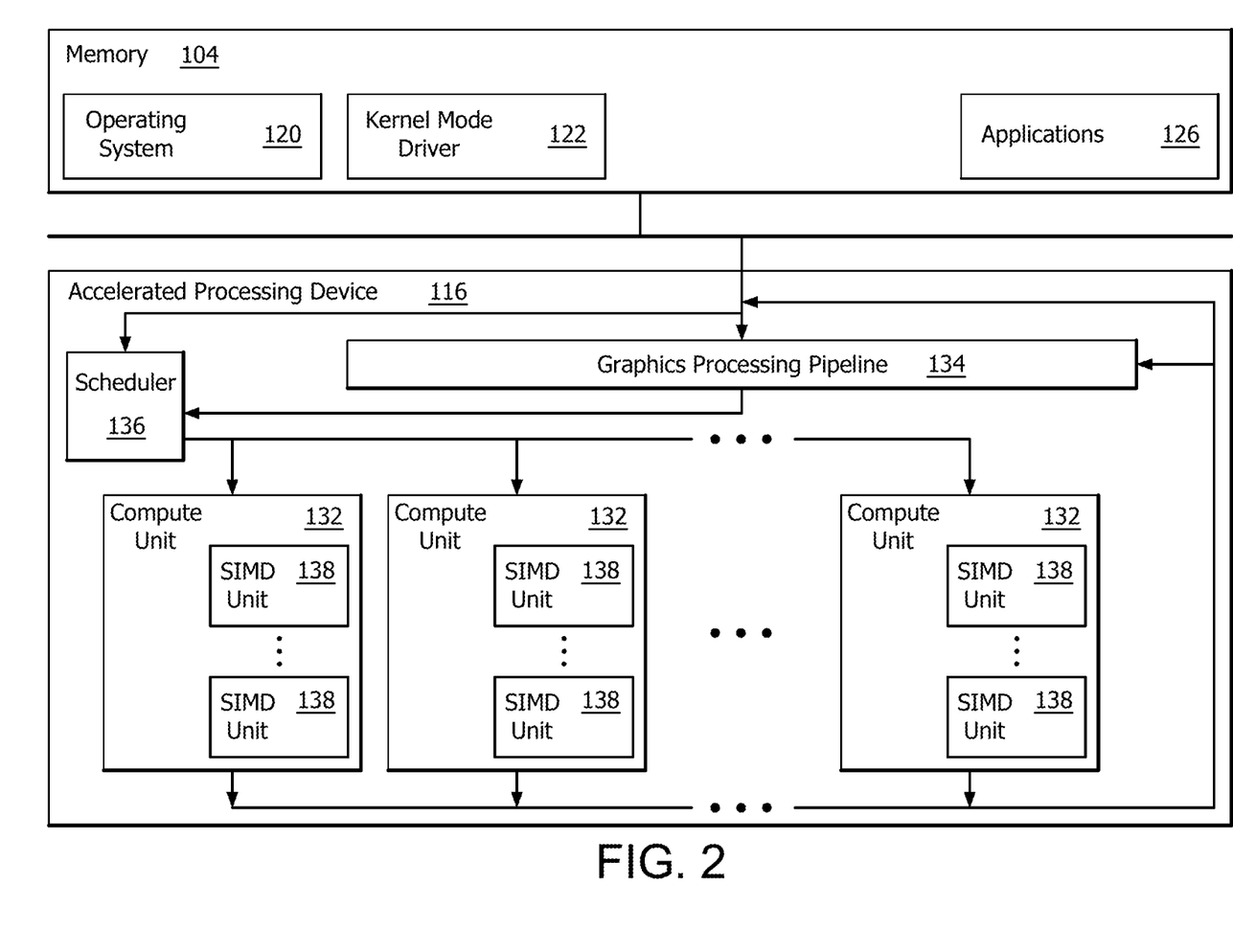
FIG. 2 is a block diagram of the device of FIG. 1, illustrating additional detail.

FIG. 2 is a block diagram of the device 100, illustrating additional details related to execution of processing tasks on the APD 116. The processor 102 maintains, in system memory 104, one or more control logic modules for execution by the processor 102. The control logic modules include an operating system 120, a kernel mode driver 122, and applications 126. These control logic modules control various features of the operation of the processor 102 and the APD 116. For example, the operating system 120 directly communicates with hardware and provides an interface to the hardware for other software executing on the processor 102. The kernel mode driver 122 controls operation of the APD 116 by, for example, providing an application programming interface ("API") to software (e.g., applications 126) executing on the processor 102 to access various functionality of the APD 116. The kernel mode driver 122 also includes a just-in-time compiler that compiles programs for execution by processing components (such as the SIMD units 138 discussed in further detail below) of the APD 116.

The APD 116 executes commands and programs for selected functions, such as graphics operations and non-graphics operations that may be suited for parallel processing. The APD 116 can be used for executing graphics pipeline operations such as pixel operations, geometric computations, and rendering an image to display device 118 based on commands received from the processor 102. The APD 116 also executes compute processing operations that are not directly related to graphics operations, such as operations related to video, physics simulations, computational fluid dynamics, or other tasks, based on commands received from the processor 102.

The APD 116 includes compute units 132 that include one or more SIMD units 138 that perform operations at the request of the processor 102 in a parallel manner according to a SIMD paradigm. The SIMD paradigm is one in which multiple processing elements share a single program control flow unit and program counter and thus execute the same program but are able to execute that program with different data. In one example, each SIMD unit 138 includes sixteen lanes, where each lane executes the same instruction at the same time as the other lanes in the SIMD unit 138 but can execute that instruction with different data. Lanes can be switched off with predication if not all lanes need to execute a given instruction. Predication can also be used to execute programs with divergent control flow. More specifically, for programs with conditional branches or other instructions where control flow is based on calculations performed by an individual lane, predication of lanes corresponding to control flow paths not currently being executed, and serial execution of different control flow paths allows for arbitrary control flow.

The basic unit of execution in compute units 132 is a work-item. Each work-item represents a single instantiation of a program that is to be executed in parallel in a particular lane. Work-items can be executed simultaneously as a "wavefront" on a single SIMD processing unit 138. One or more wavefronts are included in a "work group," which includes a collection of work-items designated to execute the same program. A work group can be executed by executing each of the wavefronts that make up the work group. In alternatives, the wavefronts are executed sequentially on a single SIMD unit 138 or partially or fully in parallel on different SIMD units 138. Wavefronts can be thought of as the largest collection of work-items that can be executed simultaneously on a single SIMD unit 138. Thus, if commands received from the processor 102 indicate that a particular program is to be parallelized to such a degree that the program cannot execute on a single SIMD unit 138 simultaneously, then that program is broken up into wavefronts which are parallelized on two or more SIMD units 138 or serialized on the same SIMD unit 138 (or both parallelized and serialized as needed). A scheduler 136 performs operations related to scheduling various wavefronts on different compute units 132 and SIMD units 138.

The parallelism afforded by the compute units 132 is suitable for graphics related operations such as pixel value calculations, vertex transformations, and other graphics operations. Thus in some instances, a graphics pipeline 134, which accepts graphics processing commands from the processor 102, provides computation tasks to the compute units 132 for execution in parallel.

The compute units 132 are also used to perform computation tasks not related to graphics or not performed as part of the "normal" operation of a graphics pipeline 134 (e.g., custom operations performed to supplement processing performed for operation of the graphics pipeline 134). An application 126 or other software executing on the processor 102 transmits programs that define such computation tasks to the APD 116 for execution.

Figure 3:
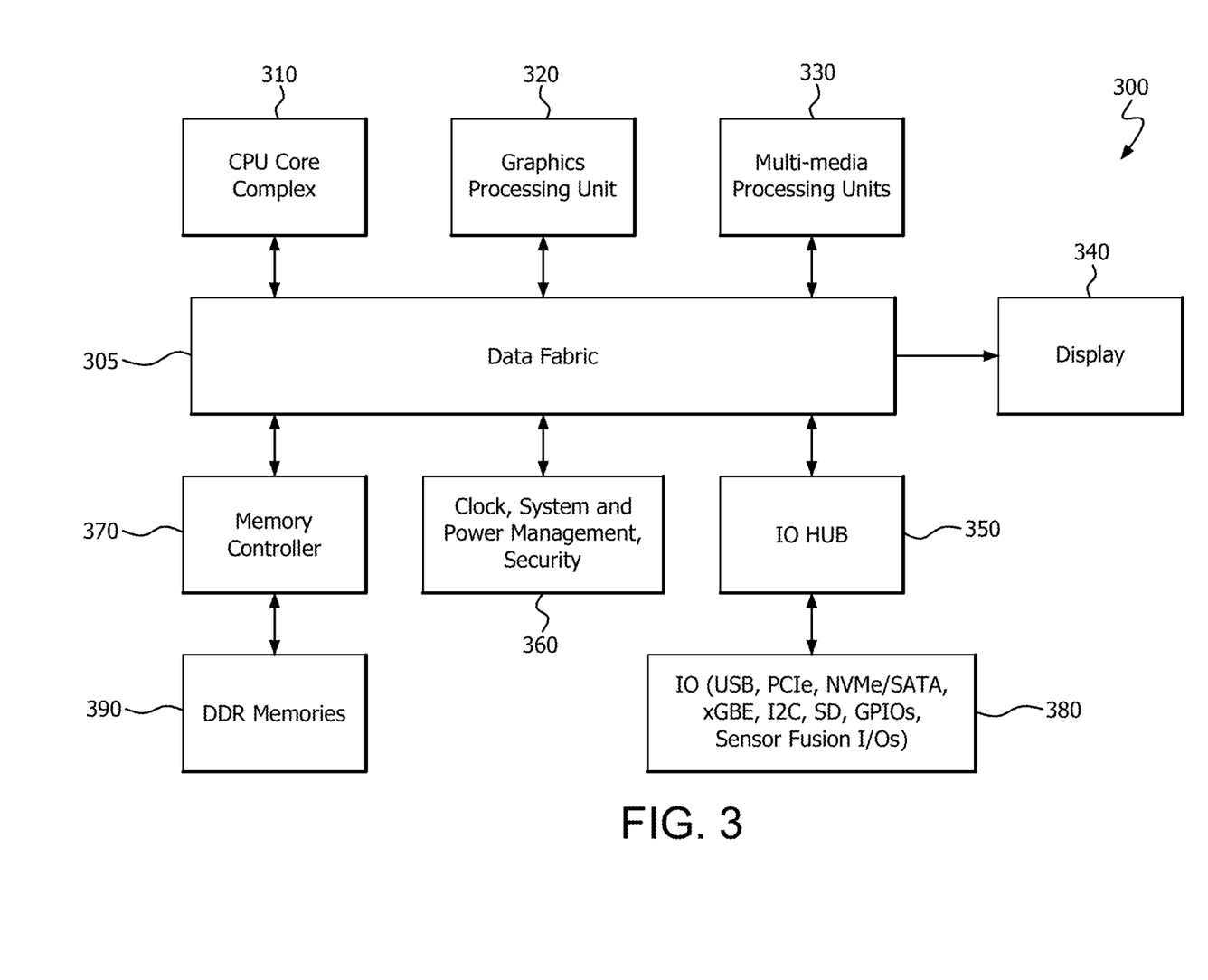
FIG. 3 is a block diagram illustrating an example system-on-a-chip (SoC) device in which one or more features of the disclosure can be implemented.

FIG. 3 is a block diagram illustrating an example system-on-a-chip (SoC) device 300 in which one or more features of the examples discussed herein are implemented. SoC device 300 includes a data fabric 305, CPU core complex 310, GPU 320, Multi-media processing units (MPUs) 330, display interface 340, I/O hub 350, clock, system and power management, and security block 360, and memory controller 370. Data fabric 305 includes circuitry for providing communications interconnections among the various components of SoC device 300. Any suitable interconnection hardware is used in various implementations. In some implementations, from a physical standpoint, data fabric 305 is implemented either in a central location of the SoC device, or distributed to multiple hubs across the SoC device and interconnected using a suitable communications medium (e.g., a bus). From a logical standpoint, data fabric 305 is located at the center of data flow, and information regarding the idleness of different blocks is concentrated (e.g., stored) in data fabric 305. In some implementations, this information is used in determining an appropriate time to transition into S0ix states.

CPU core complex 310 includes one or more suitable CPU cores. Each of the cores in a complex includes a private cache and all of the cores in a complex are in communication with a shared cache. In some implementations, SoC device 300 includes a plurality of CPU core complexes. GPU 320 includes any suitable GPU or combination of GPU hardware. MPUs 330 include one or more suitable MPUs, such as audio co-processors, imaging signal processors, video codecs, and so forth.

Display interface 340 includes any suitable hardware for driving one or more displays. I/O hub 350 includes any suitable hardware for interfacing the data fabric 305 with I/O devices 380. In some implementations, I/O devices 380 include one or more of a universal serial bus (USB), peripheral component interconnect express (PCIe) bus, non-volatile memory host controller interface (NVMe) bus, serial advanced technology attachment (SATA) bus, gigabit Ethernet (xGBE), inter-integrated circuit (I2C) bus, secure digital (SD) interface, general purpose input/output (GPIO) connection, sensor fusion I/O connection, and/or any other suitable I/O hardware. Accordingly, in some implementations, I/O hub 350 includes a USB host controller, PCIe root complex, NVMe host controller, SATA host controller, xGBE interface, I2C node, SD host, GPIO controller, sensor fusion controller, and/or any other suitable I/O device interfaces.

Clock, system and power management, and security block 360, which is also referred to as a system management unit (SMU), includes hardware and firmware for managing and accessing system configuration and status registers and memories, generating clock signals, controlling power rail voltages, and enforcing security access and policy for SoC device 300. In some implementations, security block 360 is interconnected with the other blocks of SoC device 300 using a system management communication network (not shown). In some implementations, security block 360 is used in managing entry into and exit from multi-tier S0ix states, e.g., using information from data fabric 305.

Memory controller 370 includes any suitable hardware for interfacing with memories 390. In some implementations, memories 390 are dual data rate (DDR) memories. Example DDR memories include DDR3, DDR4, DDR5, LPDDR4, LPDDR5, GDDR5, GDDR6, and so forth.

In some examples, SoC device 300 is implemented using some or all of the components of device 100 as shown and described with respect to FIGS. 1 and 2. In some implementations, device 100 is implemented using some or all of the components of SoC device 300.

In some systems that support power management states, the fully-on state is referred to as a working state. In systems which comply with the Advanced Configuration and Power Interface™ (ACPI) standard, from the system perspective, various "sleep" or S-states are defined, such as S0, S1, S2, S3, S4, and S5. The fully-on working state is referred to as the S0 state. Although S0 is referred to as a sleep state, S0 is a working state and the system is not "sleeping" in the S0 state. The terms working state and S0 state are used interchangeably herein for convenience, however it is noted that the principles, techniques, and devices discussed herein are applicable to both ACPI and non-ACPI systems regardless of terminology.

In the S0 state, typically, all subsystems are powered and the user can engage all supported operations of the system, such as executing instructions. If some or all of the subsystems are not being operated, maintaining the S0 state presents an unnecessary waste of power except under certain circumstances. Accordingly, in some examples, if a system in the S0 state meets certain entry conditions it will enter one of a number of power management states, such as a hibernate or a soft-off state (if supported).

Whether the system enters a given power management state from the S0 state depends upon certain entry conditions, such as latency tolerance. Generally speaking, a system in a deeper power management state saves more energy but takes longer to recover to the working or S0 state—i.e., incurs a greater latency penalty—than the system in a power management state that is not as deep. For example, if the operating system (or, e.g., SoC device 300, or processor 102, or data fabric 305, or security block 360) receives latency information, e.g., a latency tolerance report (LTR) from a Peripheral Component Interconnect Express (PCIe) or I/O interface indicating a latency tolerance of a connected peripheral device, this tolerance is compared with the latency required to recover the S0 state from various available power management states. If the latency tolerance is met by one of the power management states, the latency entry condition for the power management state has been met. Assuming that latency tolerance is the only entry condition, for the sake of illustration, and assuming the latency tolerance for more than one power management state has been met, the system will enter the deeper power management state to conserve more power in some examples.

In ACPI systems, power on suspend (POS), CPU off, and sleep states are referred to as S1, S2, and S3 states respectively, and these terms are used interchangeably herein for convenience. S3 is considered to be a deeper power management state than S2, and saves more power at the cost of a higher latency penalty. S2 is considered to be a deeper power management state than S1, and saves more power at the cost of a higher latency penalty. Deeper power management states are also referred to interchangeably as lower power management states.

In ACPI systems, hibernate states and soft-off states are referred to as S4 and S5 states respectively, and these terms are used interchangeably herein for convenience. S5 is considered to be a deeper power management state than S4, and saves more power at the cost of a higher latency penalty.

In a typical S4 state, the system stores its operating system state and memory contents to nonvolatile storage in a hibernation file. Main memory in such systems typically includes dynamic random access memory (DRAM), which requires regular self-refresh. Because the memory state is saved to a hibernation file in nonvolatile storage, the DRAM no longer requires self-refresh and can be powered down. Typically, much of the system is powered down in an S4 state, including static random access memory (SRAM). Accordingly, entering the S4 state has the advantage of reducing power consumption. In determining whether to enter the S4 state, the power consumption savings of the S4 state are balanced against the time required to resume working operation of the system (i.e., time to re-enter the S0 state—the latency penalty) including powering the DRAM and other components, and restoring the memory contents from the hibernation file, for example.

In a typical S5 state, the system does not store its operating system and memory state. S5 is a deeper and slower state than S4. As in the S4 state, the S5 state saves power by turning off DRAM memory; however it can enter the state more quickly because it does not need to generate a hibernation file. Among other things, these advantages are balanced against the time required to resume the S0 state (i.e., latency penalty) by both powering the DRAM and restarting the user session. S5 is similar to a mechanical off state, except that power is supplied to a power button to allow a return to S0 following a full reboot.

Some systems also provide low-power idle states to which the system can transition from the S0 state. In some systems, idle states are considered sub-states of the S0 state, and are referred to as internal states, or S0ix states (in ACPI parlance), and these terms are used interchangeably herein for convenience. As with the S4 and S5 states, whether the system enters an S0ix state from the S0 state depends upon certain entry conditions. S0ix states can include short idle states and long idle states. In some systems, short-idle states and long-idle states are referred to as S0i1, and S0i3 states respectively, and these terms are used interchangeably herein for convenience. As with S4 and S5, each of the S0ix states includes various power management interventions.

In an S0i1 state, the system remains largely active. Certain subsystems are shut down or voltage-reduced to save power. For example, in some implementations of an S0i1 state, CPU and/or GPU cores are power gated or turned off (e.g., by one or more corresponding voltage regulators) for a percentage of time. In some implementations, certain power rails are only powered (or fully powered), e.g., by voltage regulators, in the S0 state (i.e., are fully turned off, e.g., by one or more corresponding voltage regulators, in all other system power management states; e.g., S4 or S5 states), and are referred to collectively as the S0 voltage domain. The S0 voltage domain is normally powered by S0 domain voltage regulators at all times. To save power, certain portions of the S0 domain circuitry are shut off in the S0i1 state under certain idle conditions, and such portions of the S0 domain are referred to as on-off regions (ONO). Certain portions of the circuitry are not shut down or reduced in voltage in the S0 power management state however. In cases where certain portions of the circuitry are never turned off or reduced in voltage in the S0 state, such portions are referred to as always-on regions (AON).

In the S0i1 state, the display remains on, displaying a static page. In some implementations, the static page is displayed using a panel self-refresh (PSR) mode. Other devices, such as memory controllers, remain on in addition to the display and the data fabric. In some implementations, some or all multimedia processors (e.g., audio co-processors, imaging signal processors, video codecs, etc.) remain on. Because most of the system remains active, including the main memory DRAM, the system can enter the S0i1 state and resume the S0 state from the S0i1 state more quickly (e.g., on the order of micro-seconds in some implementations) than from the S4 and S5 states (e.g., on the order of seconds to over a minute in some implementations). For example, at typical processor speeds S0i1 occurs frequently, such as between keystrokes. This advantage is balanced against power savings that is less dramatic than the S4 and S5 states, for example, due to the main memory DRAM remaining energized.

In an S0i3 state, the system is less active than the S0i1 state. For example, in some implementations of an S0i3 state, various S0 power domain power supply rails supplying components to be shut down in the S0i3 state are gated or turned off at voltage regulators. In some implementations the gated S0 power domain supply rails are the same rails gated or turned off at voltage regulators in the S3 power state, the voltage regulators are managed as in S3 state, and all S0 domain power supplies are turned off to save on-die power. Essentially, the S0 voltage domain is shut down in the S0i3 state. S0 domain power rails are used to meet the supply needs of various blocks and/or domains ("IPs") in a SOC, and examples include VDDCR_SOC, VDDP, VDD18 and VDD33 rails. For example, in some implementations VDDCR_SOC powers all major non-CPU and/or non-GPU system IPs, this supply rail provides either fixed or variable supply voltage levels to support CPU, GPU, and multimedia processor functionality and data transfer bandwidth and activities. In some implementations, VDDP is a fixed voltage rail that provides a defined digital voltage to support IPs that need a fixed voltage supply. VDD18 is a 1.8V voltage supply and VDD33 is a 3.3V voltage supply. VDD18 and VDD33 are needed for different I/O applications and specifications.

VDDCR_SOC is used as an example herein for description of power gating or reduction, or frequency reduction, for various states. However in various implementations, other rails or designations are possible. Various S0 domain power supply voltage regulators are turned off to save off-die power in the S0i3 state. Information stored in memory (e.g., SRAM) powered by these supplies is stored (i.e., "backed-up") to other memory, such as main memory (e.g., DRAM) or a backing store. In some implementations, the Universal Serial Bus (USB) does not actively transfer data in the S0i3 state and enters a suspended mode. Sensing the USB bus to detect a signal to wake up from the suspended mode requires a much slower clock than is used for data transfer; accordingly, the clock signal provided to the USB can be shut down, leaving the USB to rely on its own, slower clock. Further, various other voltage domains of the system that power components to be shut down in the S0i3 state, can be turned off or "gated".

Because less of the system is active in the S0i3 state than in the S0i1 state, the system uses less power than the S0i1 state. This advantage is offset however, as the system cannot resume the S0 state from S0i3 as quickly, for example, due to the time required to bring the powered-off power domains back up to operating voltage, restoring the backed-up information to its original memory (e.g., SRAM), and to restart the USB data transfer clock. In some implementations restoring the backed-up information to its original memory requires the involvement of the OS, BIOS, drivers, firmware, and the like, contributing to the required time.

In order for entry into the S0i3 state from S0i1 to yield a net power savings, the system would need to remain in the S0i3 state long enough to offset the power required to effect the various steps involved in entering the S0i3 state from S0i1, and returning to S0i1 or S0 state from S0i3. The minimum time during which the system would need to remain in the S0i3 state to yield a power savings is referred to as a residency requirement of the S0i3 state, and is an entry condition for the S0i3 state with respect to S0i1 in some implementations.

Some systems also provide another form of long-idle power management state to which the system can transition from the S0 state. Such additional long-idle power management state is referred to as an S0i2 state in ACPI parlance, and these terms are used interchangeably for convenience. In the S0i2 state, the voltage of various supply rails, such as S0 domain power supplies (e.g., VDDCR_SOC) can be reduced to save on-die power. Various voltage regulators are also reduced to save off-die power. As opposed to S0i3 states, where these voltages are turned off, in S0i2, they are lowered to a level where data state information is retained; i.e., information stored in memory (e.g., SRAM) powered by these supplies is maintained and does not need to be backed-up. In some examples this level is referred to as a retention voltage or retention level. At the retention level, the memory has enough power to maintain stored information, but not enough power to perform normal operations on the information.

Because more of the system is active in the S0i2 state than in the S0i3 state, the system uses more power in the S0i2 state than in the S0i3 state. However, because less of the system is active in the S0i2 state than in the S0i1 state, the system uses less power in the S0i2 state than in the S0i1 state. The system cannot resume the S0 state from S0i2 as quickly as from the S0i1 state, for example, due to the time required to bring the regulated voltages up from the retention level to the normal operating level. Because the system does not need to restore backed-up information or turn S0 voltage supplies back on however (among other reasons), a system in the S0i2 state requires less time to resume the S0 state than from the S0i3 state.

In order for entry into the S0i2 state from S0i1 (or another state) to yield a net power savings, the system would need to remain in the S0i2 state long enough to offset the power required to effect the various steps involved in entering the S0i2 state from S0i1, and returning to S0i1 from S0i2. The minimum time during which the system would need to remain in the S0i2 state to yield a power savings is referred to as the residency requirement of the S0i2 state, and is an entry condition for the S0i2 state in some implementations.

In some implementations, a tiered approach is applied to power management state handling. In some examples, a tiered approach to S0i2 includes more than one sub-state between the S0i1 and S0i3 states. In some examples, such sub-states are referred to as S0i2.x sub-states in ACPI parlance, and these terms are used interchangeably for convenience. In some cases, dividing a low-power state into tiers (e.g., using sub-states) in this way has the advantage of improving or optimizing power savings and recovery time. As with S0i1, Si03, S4, and S5, each of the S0i2.x sub-states includes various power management interventions. In some examples, the S0i2.x sub-states include power management interventions similar to one another, differing largely (or only) in degree. In various implementations, different S0i2.x sub-states provide different amounts of power savings and incur different amounts of control complexity.

In an example S0i2.0 sub-state, VDDCR_SOC is reduced from its typical operation voltage to a retention voltage. At the retention voltage, VDDCR_SOC supplies enough power to its associated memories (e.g., SRAM) to retain the saved information, but is below the voltage required to read from or write to the SRAM. In this example, the typical operational voltage for VDDCR_SOC is referred to as $V_{S0}$ (e.g., 0.7), and for the S0i2.0 sub-state it is lowered to a retention voltage referred to as $V_{S0i2.0}$ (e.g., 0.6 volts).

In some examples, all clocks associated with VDDCR_SOC are either switched off or set below a certain threshold, referred to as $F_{S0i2.0}$ (e.g., 100 megahertz), in order to reduce power consumption due to switching. The phase locked loop or loops used to generate reference clock signals, which can be referred to as CGPLL, remains active however.

In an example S0i2.1 sub-state, VDDCR_SOC is reduced from its typical operation voltage to a retention voltage, as in the S0i2.0 sub-state. As mentioned earlier, for this example, the typical operational voltage for VDDCR_SOC is referred to as $V_{S0}$ (e.g., 0.7). For S0i2.1 however, VDDCR_SOC is lowered to a retention voltage referred to as $V_{S0i2.1}$ (e.g., 0.5 volts). This assumes that $V_{S0i2.1}$ volts is also an effective retention voltage for the memories associated with VDDCR_SOC (e.g., SRAM) when the SRAM is not expected to be read or written.

Also in this example, all clocks associated with VDDCR_SOC are shut off and the phase locked loop generating the reference clock signals (CGPLL) is shut down to save additional power. In some implementations, various off-die clocks, such as those used for I/O, are switched over from CGPLL to a crystal oscillator or to local ring-oscillator (RO) clock sources.

As can be discerned from these examples, the S0i2.1 sub-state reduces or eliminates more power consumption than the S0i2.0 sub-state when the active clock and data switching power is also cut down, but will take longer to return to the S0 state due to, among other things, a longer time required to transition to the SRAM operating voltage from the retention voltage and extra time to restore the clocks.

In these examples, from a voltage level perspective, the difference between S0i2.x sub-states is primarily (or in some examples, entirely) a matter of degree, as compared with other power management states. For example, both S0i2.0 and S0i2.1 sub-states reduce the VDDCR_SOC to a retention voltage. The difference, in this example, is the degree to which the voltage is lowered. Stated another way, S0i2.x sub-states primarily include the same power management interventions with respect to supply voltages, differing only in degree, such as the level of retention voltage.

From a clocking perspective, S0i2.0 and S0i2.1 can be said to differ in more than degree. In an example S0i2.0, clock frequencies are set to $F_{S0i2.0}$ (e.g., 100 megahertz or lower). Maintaining reduced rate clocks in this way, as opposed to shutting them down, allows for wakeup events to occur in the S0 domain in some implementations. An example of such S0 domain wakeup source in S0i2.0 is the PCIe in-band wakeup. In a PCIe in-band wakeup, the PCIe end-points (EP) or root are able to imitate a wakeup due to regular PCIe signaling. In S0i2.1, however, all clocks are turned off. Accordingly, in some implementations, no operations (e.g., wakeup events) are possible in the S0 domain. In some implementations, wakeup events in the S0i2.1 sub-state are handled using S5 domain circuitry that remains powered during the S0i2.1 sub-state (and is only turned off during states below S5).

Providing tiered S0i2.x sub-states in this manner also provides the possible advantage of permitting finer calibration of power management states. For example, in some implementations, a system having a greater number of S0i2.x sub-states (e.g., S0i2.2, S0i2.3, and so forth) is able to support finer differences in SRAM retention voltage, and accordingly, latency penalty. In one such example, each deeper sub-state has a retention voltage that is lower by an additional 50 or 100 millivolts, within a range valid for SRAM retention. In principle, the number of S0i2.x sub-states is arbitrary. However, increasing numbers of S0i2.x sub-states create an increased tradeoff between complexity and power savings.

Figure 4:
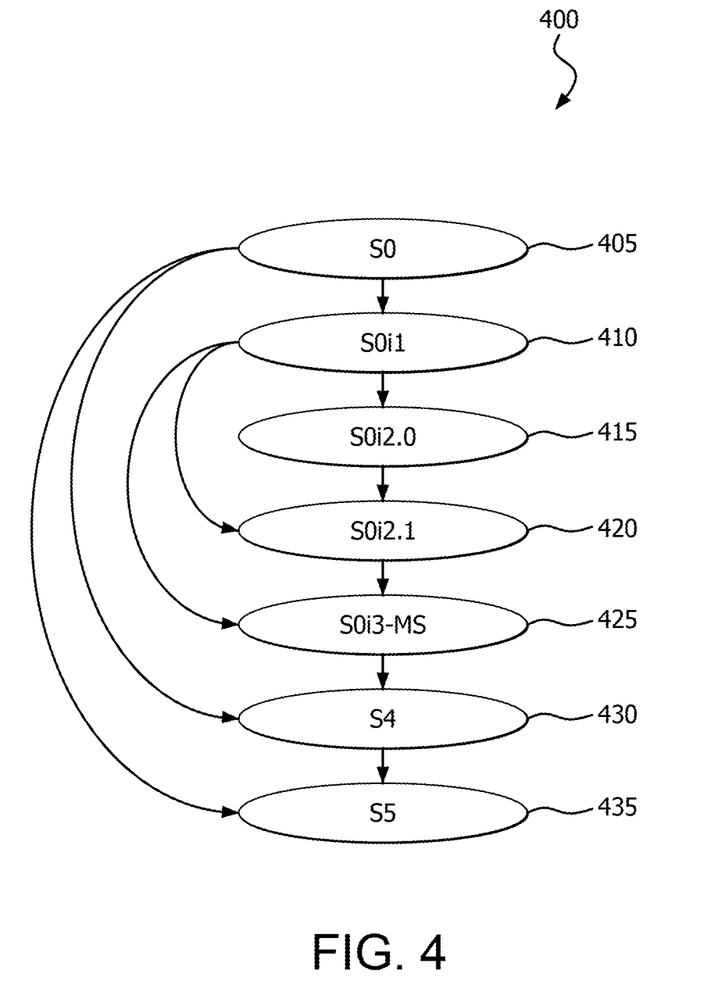
FIG. 4 is a state diagram illustrating example transitions between power management states.

FIG. 4 is a state diagram illustrating example state transitions 400 between example power management states and sub-states. From the working S0 state 405, it is possible to transition to the S4 state 430, the S5 state 435, or to the S0i1 sub-state 410. Which transition is made depends on the entry conditions and residency requirements for each state or sub-state as discussed further herein. From the S0i1 sub-state 410, it is possible to transition to the S0i2.0 or S0i2.1 sub-states, also depending upon entry conditions and residency requirements.

Whether a state transition occurs to a low-power system state or sub-state depends upon various entry conditions and residency requirements. In general, the purpose of the entry conditions and residency requirements is to determine whether a state or sub-state would meet latency targets for returning to the working S0 state, and properly balance the latency penalty of the state or sub-state with the anticipated power savings of that state or sub-state. For example, in some implementations entry conditions are used to determine whether to enter either the S0i2.0 or S0i2.1 sub-state from the S0i1 state. If the latency penalty for both of these is unacceptable, no state transition will take place to those sub-states. If the latency penalty for S0i2.1 is acceptable, then the state will transition to S0i2.1 because it represents a greater power savings than S0i2.0.

In more detail, transitions to and from a run-time low power state or sub-state (e.g., S0i1, S0i2.0, S0i2.1, or S0i3) involve various actions to be taken by the system and power management unit, and thus extra power is needed for such transitions. "Deeper" standby states or sub-states require a greater number of, or more resource-intensive actions (e.g., as described above regarding various power management states) for entry than states or sub-states that are less deep. In some implementations, the higher cost (e.g., in power and/or latency) of going into deeper standby or sleep modes is justified by higher residency (i.e., the time remaining in that state) such that the low power mode is power neutral.

In some implementations, the time and power cost of entering and exiting the S0i3 state is significantly larger than either the S0i2.0 or S0i2.1 sub-states. In an example, entry into and return from the S0i3 state is only power-neutral after a residency of 5 seconds or even 10 seconds or more. Accordingly, in an example case, unless the system will stay in the S0i3 state for more than 5 seconds, the system will enter an S0i2.x sub-state from S0i1 (assuming that latency requirements for the S0i2.x sub-state are met).

In some implementations, the tiered low power states (i.e., S0i2.x) take projected latency into account, increasing the likelihood that the system will transition to an optimal state or sub-state at the outset and reducing the possibility of incurring a power penalty due to entering a wrong (i.e., not power neutral or power saving) state or sub-state.

Figure 5:
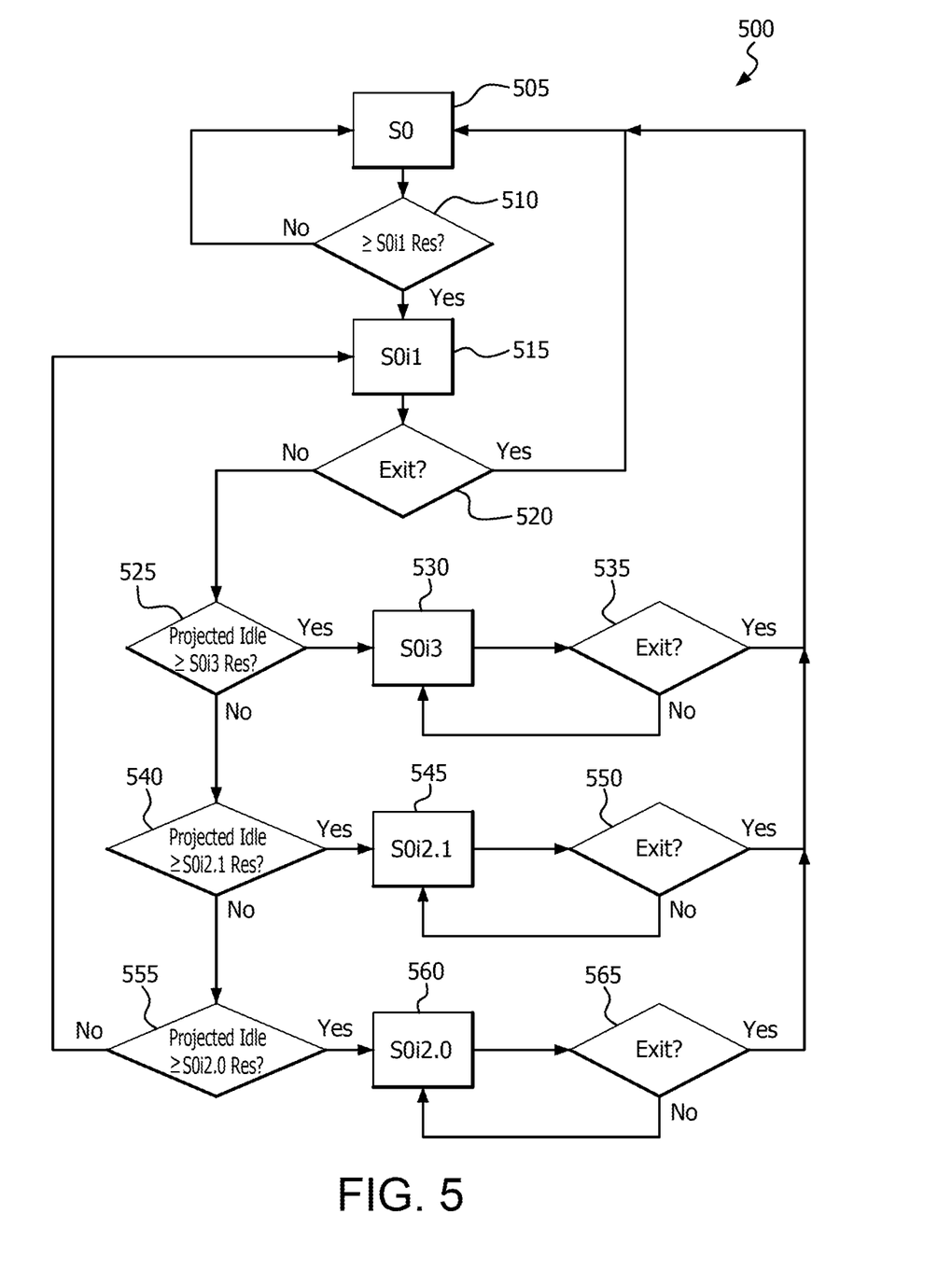
FIG. 5 is a flow chart illustrating example transitions among long idle states based on projected latency.

FIG. 5 is a flow chart illustrating example transitions 500 among long idle states and sub-states based on projected latency. Transitions 500 begin from the working state S0 in step 505. On a condition S10 that the system is idle for a time exceeding the S0i1 residency requirement, the system transitions to the S0i1 state in step 515. Unless an S0i1 exit condition occurs in step 520, the system determines whether to enter deeper state or sub-state based on a projected idle time. In some implementations the projected idle time is determined, based on historical idle times in the S0i1 state for example, or on any other suitable basis. On a condition 525 that the projected idle time exceeds the S0i3 residency requirement, the system enters the S0i3 state in step 530, and remains in that state until a condition 535 that an S0i3 exit condition is met, in which case the system returns to the S0 state in step 505.

On a condition 540 that the projected idle time exceeds the S0i2.1 residency requirement, the system enters the S0i2.1 sub-state in step 545, and remains in that sub-state until a condition 550 that an S0i2.1 exit condition is met, in which case the system returns to the S0 state in step 505.

On a condition 555 that the projected idle time exceeds the S0i2.0 residency requirement, the system enters the S0i2.0 sub-state in step 560, and remains in that sub-state until a condition 565 that an S0i2.0 exit condition is met, in which case the system returns to the S0 state in step 505.

To avoid premature entry into S0i3, in some implementations, a timer is used to delay the S0i3 entry. In some implementations, the timer is a hysteresis timer used to delay entrance into the next state by remaining in a historic state after entry conditions for a next state are met, and testing whether the entry conditions are still met after expiration of the timer. If conditions are met after expiry of the timer (or remain met), the state transitions. If the conditions are no longer met after expiry of the timer, the state does not transition and the timer is reset. In some implementations, if a timer is set to a certain level, the success rate of entering S0i3 with positive power savings increases. During a S0i3 entry timer period, in some implementations, the system enters a S0i2.x sub-state to save power. To prevent the system from looping within S0i2.x sub-states without entering the S0i3 state, in some implementations a timer is set as a wake source to bring the system back to S0 or S1. This approach can be referred to as a "blinking mode" to describe where wake events occur during S0i2.x sub-states to provide an opportunity for eventual entry into the S0i3 state.

Accordingly, in some implementations, the tiered low power states (i.e., S0i2.x) include a hysteresis timer to increase the likelihood that the system will transition to an optimal state or sub-state at the outset and reducing the possibility of incurring a power penalty due to entering a wrong (i.e., not power neutral or power saving) state or sub-state.

Figure 6:
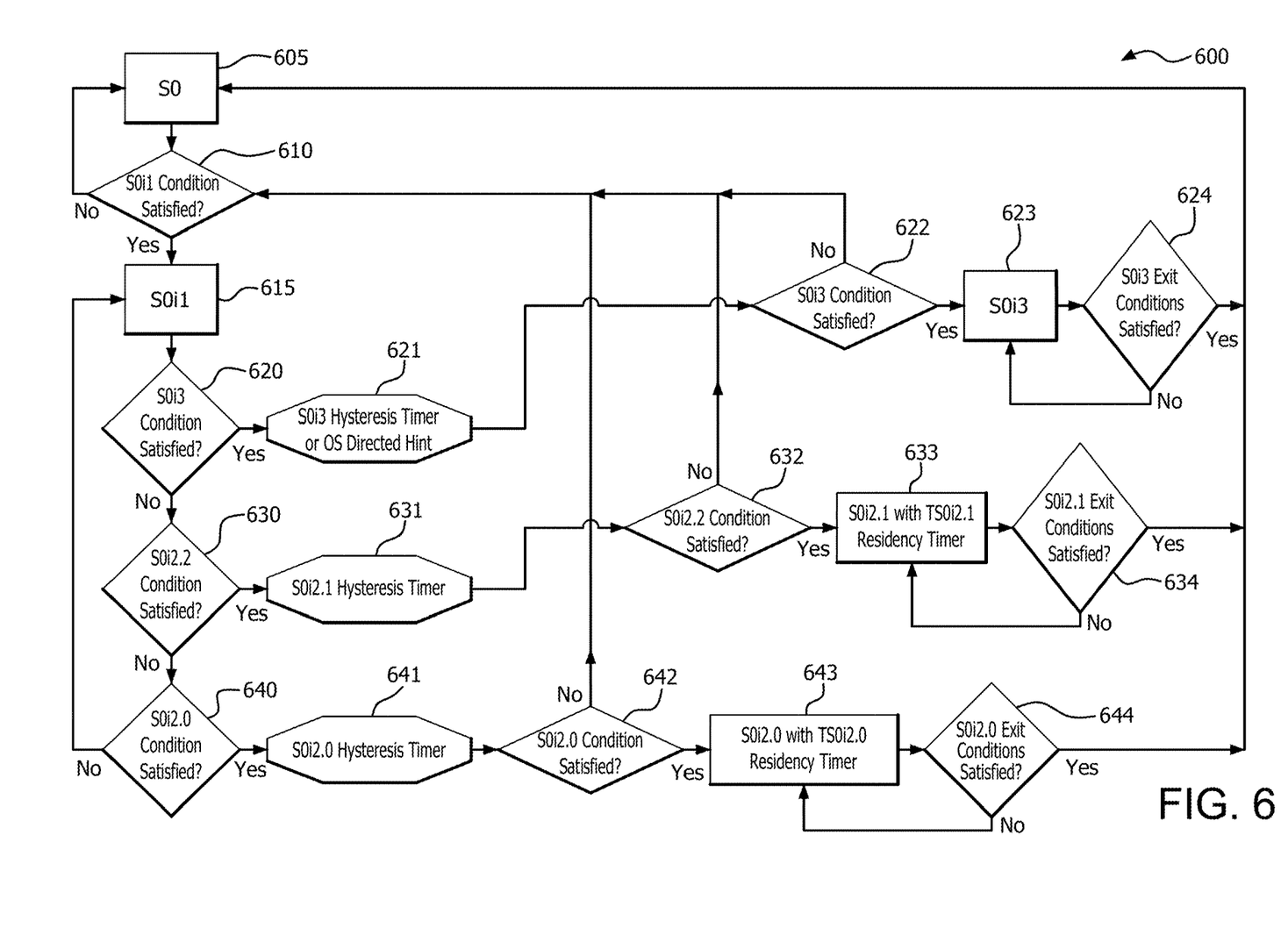
FIG. 6 is a flow chart illustrating example transitions among long idle states based on hysteresis timers.

FIG. 6 is a flow chart illustrating example transitions 600 among long idle states and sub-states based on projected latency. Transitions 600 begin from the working state S0 in step 605. On a condition 610 that the system is idle for a time exceeding the S0i1 residency requirement, the system transitions to the S0i1 state in step 615.

Unless an S0i1 exit condition occurs during step 615 (where S0i1 would exit to S0 at step 605 in this example), the system determines whether to enter deeper state or sub-state based on a combination of entry conditions and a timer.

On a condition 620 that entry conditions for entry into the S0i3 state are satisfied, a timer (e.g., a hysteresis timer) is started at step 621. In some embodiments, instead of, or in addition to a timer, the system waits for a signal from the operating system (e.g., an operating system hint) before proceeding. In this context, the operating system hint indicates that the system should proceed to the S0i3 state if entry conditions are satisfied. After expiry of the timer or receipt of the operating system hint, the entry conditions for S0i3 are again checked to determine if they are still satisfied. On a condition 622 that the conditions are still satisfied, the system enters the S0i3 state in step 623, and remains in that state until a condition 624 that an S0i3 exit condition is met, in which case the system returns to the S0 state in step 605. On a condition 622 that the conditions are not still satisfied, the system returns to step 610.

On a condition 620 that entry conditions for entry into the S0i3 state are not satisfied, it is determined whether conditions for entry into the S0i2.1 sub-state are satisfied.

On a condition 630 that entry conditions for entry into the S0i2.1 sub-state are satisfied, a timer (e.g., a hysteresis timer) is started at step 631. After expiry of the timer or receipt of the operating system hint, the entry conditions for S0i2.1 are again checked to determine if they are still satisfied. On a condition 632 that the conditions are still satisfied, the system enters the S0i2.1 sub-state in step 633, and remains in that sub-state until a condition 634 that an S0i2.1 exit condition is met, in which case the system returns to the S0 state in step 605. On a condition 632 that the conditions are not still satisfied, the system returns to step 610.

On a condition 630 that entry conditions for entry into the S0i2.1 sub-state are not satisfied, it is determined whether conditions for entry into the S0i2.0 sub-state are satisfied.

On a condition 640 that entry conditions for entry into the S0i2.0 sub-state are satisfied, a timer (e.g., a hysteresis timer) is started at step 641. After expiry of the timer or receipt of the operating system hint, the entry conditions for S0i2.0 are again checked to determine if they are still satisfied. On a condition 642 that the conditions are still satisfied, the system enters the S0i2.0 sub-state in step 643, and remains in that sub-state until a condition 644 that an S0i2.0 exit condition is met, in which case the system returns to the S0 state in step 605. On a condition 642 that the conditions are not still satisfied, the system returns to step 610.

Table 1 compares example latency penalties and residency requirements for S0 idle states and sub-states:

TABLE 1

| S0 idle states and sub-states | Latency | Power Neutral Residency |
|---|---|---|
| S0i1 | 10 us | 10-20 us |
| S0i2.0 | 50 us | 50-100 us |
| S0i2.1 | 100 us | 100-200 us |
| S0i3 | 1 to 500 ms | 1 sec-10 sec |

Figure 7:
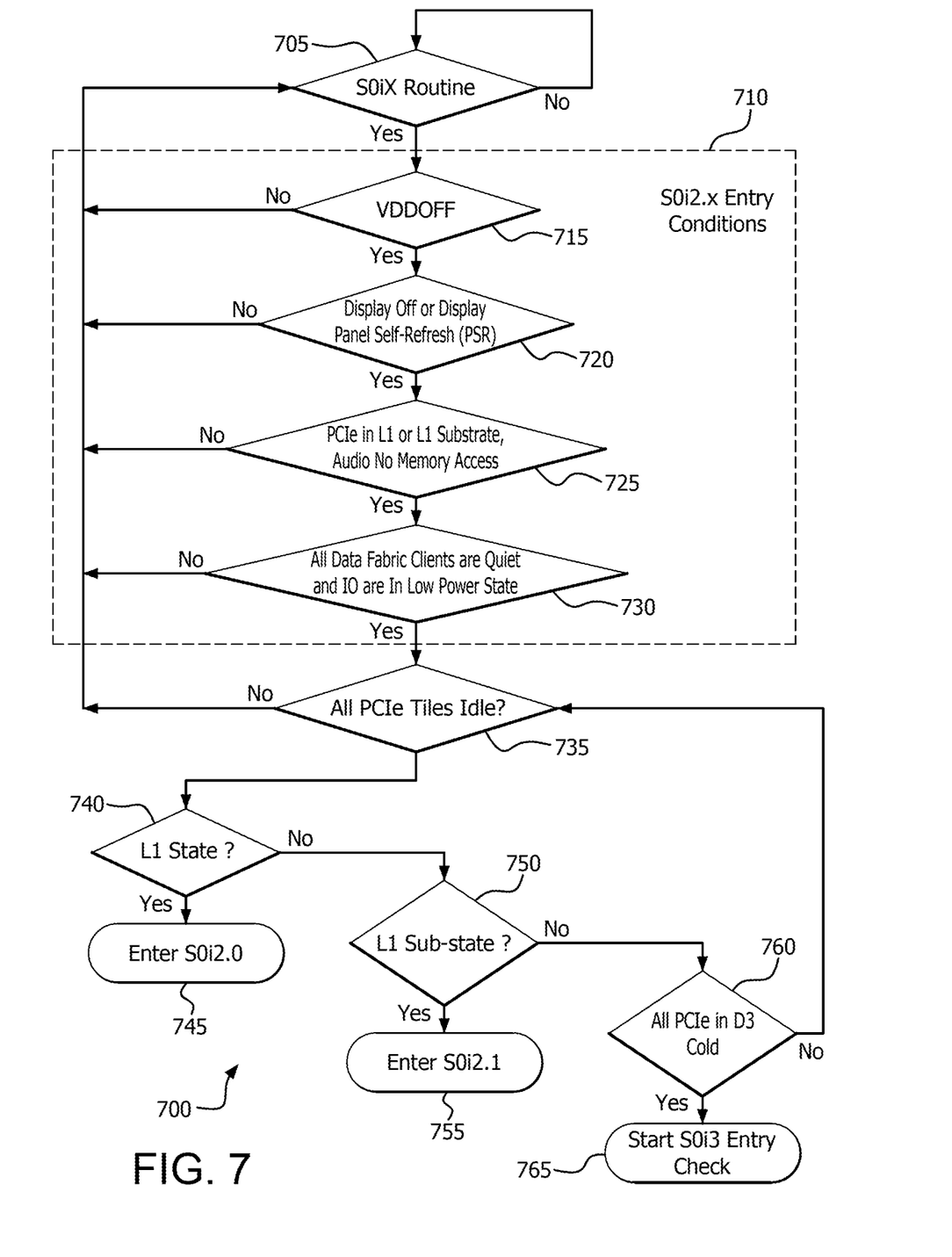
FIG. 7 is a flow chart illustrating an example procedure for transitioning among power management states.

FIG. 7 is a flow chart illustrating another example procedure 700 for transitioning among power management states and sub-states of a processor based on entry conditions. In some implementations, the state transitions are managed by an operating system (OS) executing on the processor, and by hardware units. In some examples, the OS manages transitions among the S0, S4, and S5 states, and hardware and firmware (e.g., of a system management unit (SMU)) manage transitions among the S0i1 and S0i2.x states and sub-states. S0i1 is mostly controlled by hardware (e.g., Data Fabric and/or SMU), S0i2.x sub-states are mostly controlled by firmware (e.g., SMU), and S0i3 is controlled mostly by firmware and software (e.g., SMU and OS). The various hardware, firmware, and software components which manage the state transitions are referred to as the state mechanism or state machine. On a condition 705, the state mechanism determines whether to enter an evaluation routine for entry conditions 710 to S0i2.x sub-states. Condition 705 may be triggered, for example, by a dedicated circuit on the processor or by a predefined time interval. In some cases, using a dedicated circuit rather than an OS condition, for example, has the advantage of facilitating state transitions during time periods that are below the OS latency threshold; i.e., where time periods are too short for the OS to handle. Further, the OS does not include all information regarding the specifications of the underlying hardware which are necessary to manage S0ix sub-states in some implementations.

On a condition 705 that it is determined to enter the evaluation routine, suitable hardware (e.g., SMU and its associated firmware in this example) evaluates entry conditions 710. Entry conditions 710 are only exemplary. In some examples, entry conditions 710 include other steps, or fewer steps, or the steps are performed in a different order or simultaneously. In step 715, it is determined whether the power supply to the CPU (if CPU is on this supply alone), or CPU and GPU (if CPU and GPU share the same power supply) is off. This condition is referred to as VDDOFF in the figure. In step 720, it is determined whether the system is idle and screen is turned off or in a panel self-refresh (PSR) mode displaying a static image. In step 725, it is determined whether PCIe is in an L1 link state or L1 sub-state (e.g., L1.1, L1.2, and so forth). In some examples, the link state is obtained based on reading the PCIe controller power gating status. In step 730, it is determined whether no Data Fabric clients are attempting to access memory or have interrupts pending and that all I/O is in a power management state. In this context, Data Fabric refers to a central hub for various clients, which include the CPU, GPU, and multi-media components (e.g., audio, image processing units, video codecs, memory, and I/O including PCIe, USB, SATA, NVMe, and so forth).

If all of the S0i2.x entry conditions 710 are met, it is determined whether all PCIe tiles are idle. On condition 735 that all PCIe tiles are idle, a S0ix sub-state is determined based on the current PCIe state. For example, on a condition 740 that the PCIe link state is L1, the system state transitions to S0i2.0 in step 745. On a condition 750 that the PCIe link state is a L1 sub-state and when the latency tolerance report (LTR) and other conditions allow, the system transitions to S0i2.1 in step 755. On a condition 760 that the PCIe device state is D3cold, or if the link state is L2 or L3, the system enters an evaluation routine for entry conditions to S0i3 in step 765. Because entry into S0i3 requires a comparatively larger amount of time than entry into S0i2, in some implementations the system determines to enter S0i2.x for a period of time rather than entering S0i3 immediately. In such cases, in some implementations the system loops between S0i2.x and S0 multiple times until a determination is made that it is ready to enter the S0i3 state, if entry conditions for S0i2.x are met.

In some implementations, determining entry conditions for system power management states and sub-states in this way permits the greatest (or greater, or a desired amount of) available power savings for the system while allowing for a return to the S0 state within the latency tolerance without overshoot.

Table 2 below illustrates various components contributing to exit latency from the S0i2.0 and S0i2.1 sub-states in this example. This comparison illustrates, generally, example ways in which exit latency differs among different power management states and sub-states. Each step below describes an example operation performed to exit from the example latency state. It is noted that the steps described are examples only, and that different steps, ordering of steps, and the like may be performed in various implementations. For some of the steps (e.g., 1, 2, 5), the amount of time contributed to the latency is the same for S0i2.0 and S0i2.1 in this example. For other steps (e.g., 3a, 4) the latency contribution is greater for S0i2.1 in this example. For example, the serial voltage identification interface (SVI2) voltage change takes longer in S0i2.1 (i.e., $T_{EL3a\_Si2.0} < T_{EL3a\_Si2.1}$) because the voltage is lower in S0i2.1, and accordingly takes longer to ramp up to the S0 voltage. The time required to perform these steps is also only for the sake of example, and illustrates the relative difference in total exit latency between an example power management state and a corresponding deeper power management state (sub-states S0i2.0 and S0i2.1 in this example).

TABLE 2

| Step Number | Step Description | S0i2.0 Latency | S0i2.1 Latency |
|---|---|---|---|
| 1 | Wake source to VRC | $T_{EL1\_Si2.0}$ | $T_{EL1\_Si2.1}$ |
| 2 | VRC to SVI2 | $T_{EL2\_Si2.0}$ | $T_{EL2\_Si2.1}$ |
| 3a | SVI2 voltage change | $T_{EL3a\_Si2.0}$ | $T_{EL3a\_Si2.1}$ |

TABLE 2-continued

| Step Number | Step Description | S0i2.0 Latency | S0i2.1 Latency |
|---|---|---|---|
| 3b.1 | CGPLL relock | N/A | $T_{EL3b.1\_Si2.1}$ |
| 3b.2 | CGPLL CG | N/A | $T_{EL3b.2\_Si2.1}$ |
| 3b.3 | Programmable delays of 4, 8, 16, 32 us | N/A | $T_{EL3b.3\_Si2.1}$ |
| 3 | Max of 3 a, 3b | $T_{EL3\_Si2.0}$ | $T_{EL3\_Si2.1}$ |
| 4 | PHY retraining (only for LPDDR4) | $T_{EL4\_Si2.0}$ | $T_{EL4\_Si2.1}$ |
| 5 | Stutter exit | $T_{EL4\_Si2.0}$ | $T_{EL5\_Si2.1}$ |
| Total | | $T_{EL\_TOTAL\_Si2.0}$ | $T_{EL\_TOTAL\_Si2.1}$ |

In example step 1, a wake source event (e.g., a PCIe endpoint request to exit an L1 or L1.2 state, or movement of a USB mouse, or typing on a USB keyboard, etc.) for S0i2.x occurs and is routed to a voltage regulator controller (VRC) to determine that the system should exit the current S0i2.x sub-state. In example step 2, the VRC sends a serial code to an external voltage regulator (VR) to begin ramping the voltage back up (e.g., to $V_{S0}$). Example step 3 includes step 3a and steps 3b.1, 3b.2, and 3b.3. The latency contribution of step 3 is either the 3a latency, or the sum of steps 3b.1, 3b.2, and 3b.3, whichever is greater. In example step 3a, after the VR receives the voltage ramp command from the VRC, the VR performs voltage ramp up at a predefined rate (e.g., 7 mV/us) until it reaches the target voltage. In example step 3b.1, the CGPLL relocked. In some implementations this is because the clock is turned off in S0i2.1 sub-state, and thus the clock generation PLL (i.e., CGPLL) needs to be relocked to generate the desired clock signal. In example step 3b.2, before CGPLL is fully locked and voltage stabilized, CGPLL output should be clock gated to avoid improper operation when the system is up. In example step 3b.3 a programmable delay is added to avoid clocking before the voltage ramp is complete. In some implementations this has the advantage of avoiding a race condition such that the clock and voltage are both stable enough for consuming devices to work properly. In example step 4, LPDDR4 PHY is retrained. In this example, LPDDR4 is a dual data rate memory type, PHY is the physical layer implementation of this memory, LPDDR4 PHY is retrained periodically per its specification in order to operate properly. In example step 5, the system stutter-exits to the S0 state Here, a display shows static information from a memory buffer. Meanwhile, the data fabric, memory controller, and DDR memory are in the lowest power gated state. In this way, a significant amount of power can be gated for a significant proportion of time while displaying static information. As illustrated by the example in Table 2, the total exit latency for S0i2.1 is greater than for S0i2.0 (i.e., $T_{EL\_TOTAL\_Si2.1} > T_{EL\_TOTAL\_Si2.0}$).

Whether a state transition occurs from a low-power system state or sub-state to the S0 working state depends upon the status of various exit conditions. In general, the purpose of the exit conditions is to determine if and when the system should transition to the S0 state. For example, the S0i2.0 and S0i2.1 sub-states have different exit conditions. S0i2.0 is a less "deep" low power sub-state than S0i2.1, and has more wake sources (i.e., triggers to return to the working state S0). The wakeup sources applicable to S0i2.0 but not to S0i2.1 will not return the system to the S0 working state from the S0i2.1 sub-state. One example exit condition applicable to both of these S0i2.x sub-states is a PCIe signal. In other words, if appropriate hardware (a voltage regulator controller (VRC) of the SMU in this example) receives a PCIe signal while the system is in sub-state S0i2.0 or S0i2.1, it initiates a "wake" transition to working state S0. For S0i2.0, PCIe is able to sense the in-band wake and send the wake directly to the VRC to ramp up the voltage. For S0i2.1, this in-band wake has no effect. Accordingly, in S0i2.1, PCIe sends a sideband signal to wake up the system in some examples. This sideband signal is also effective to initiate S0i2.0 wakeup.

Figure 8:
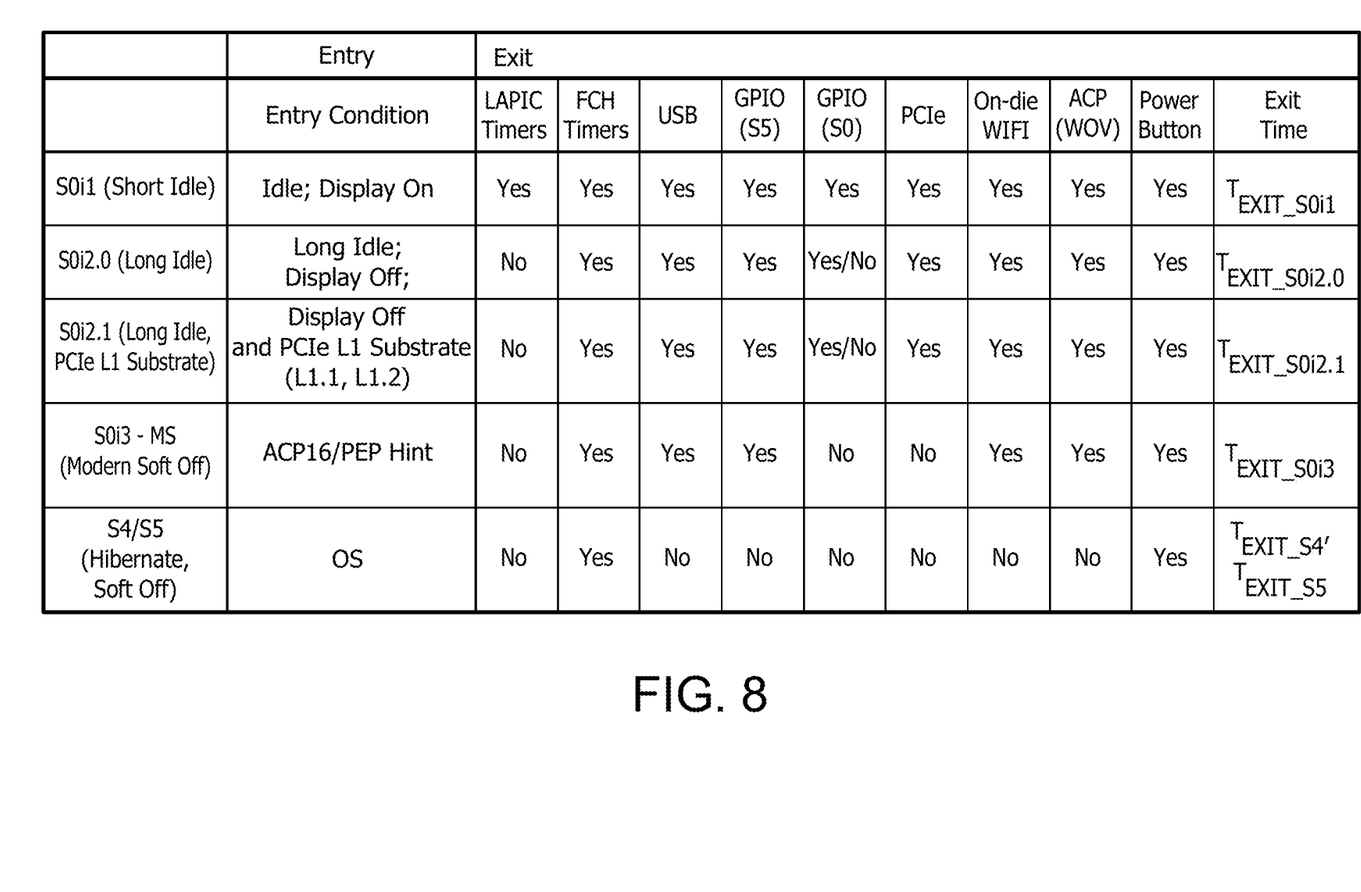
FIG. 8 is a chart summarizing various entry and exit conditions for example power management states.

FIG. 8 is a chart summarizing various example entry and exit conditions for example states S0i1, S0i2.0, S0i2.1, S0i3-MS, S4, and S5, also indicating exit times for these states and sub-states. The example entry conditions include idle, display on, long idle, display off, PCIe L1 sub-state, advanced configuration and power interface version 6 platform extension plugin (ACPI6/PEP) hint, and OS.

The idle condition signals that the system has been idle (i.e., no user interaction) for a given period of time. The display on condition signals that the display is on. The long idle condition signals that the system has been idle for a given period of time longer than the idle condition. The display off condition signals that the display is off. The PCIe L1 sub-state condition signals that the PCIe is in the L1 sub-state. The ACPI6/PEP hint and/or OS condition signals that the operating system indicates suitability of a particular power management state.

The example exit conditions include exit signals from a local advanced programmable interrupt controller (LAPIC) timer, fusion control hub (FCH) timer, USB, general purpose IO for the S5 domain (GPIO (S5)), GPIO for the S0 domain (GPIO (S0)), PCIe, On-die WiFi, audio coprocessor wakeup-on-voice (ACP (WOV)), and the power button. It is noted that these entry and exit conditions are only exemplary; any suitable entry and exit conditions are usable in other implementations.

The LAPIC timer is a programmable interrupt controller residing in the Data Fabric. The LAPIC monitors each CPU core. The LAPIC includes a timer for each CPU which counts down from an initial value to zero, and causes an interrupt to its corresponding CPU when it reaches zero. In some implementations, each LAPIC timer is able to be programmed to perform this countdown once or periodically. In the periodic case, the timer is re-loaded with the initial value each time it reaches zero. The FCH timer resides in a FCH. The FCH timer is not powered by VDDCR_SOC, and thus is usable to wake up the system even in states or sub-states where VDDCR_SOC is gated or off.

USB signals from USB devices received by the USB host controller are also usable to wake the system.

GPIO S5 is a general purpose I/O signal for the S5 domain, and is definable for certain functions. For example, in some implementations, a GPIO S5 signal is definable such that it will signal a wake when a level, or rising, or falling edge is detected. The level and/or edges are configurable.

GPIO S0 is a general purpose I/O signal for the S0 domain. GPIO S0 is definable and configurable as described with respect to GPIO S5.

ACP (WOV) signals a wake if a human voice is detected and matched with a key word.

The example exit times shown for each power management state are $T_{EXIT\_S0i1}$, $T_{EXIT\_S0i2.0}$, $T_{EXIT\_S0i2.1}$, $T_{EXIT\_S0i3}$, $T_{EXIT\_S4}$, and $T_{EXIT\_S5}$ respectively. Example values for these are $T_{EXIT\_S0i1}=10$ us, $T_{EXIT\_S0i2.0}=50$ us, $T_{EXIT\_S0i2.1}=100$ us, $T_{EXIT\_S0i3}=120$ ms, $T_{EXIT\_S4}=1$ S (e.g., time to wake screen from hibernate), and $T_{EXIT\_S5}>1$s (e.g., time to power on computer).

It should be understood that many variations are possible based on the disclosure herein. Although features and elements are described above in particular combinations, each feature or element can be used alone without the other features and elements or in various combinations with or without other features and elements.

The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A computer processing device, comprising:
    a processor coupled to a memory;
    the processor including:
        circuitry configured to transition among a plurality of power management states and at least one power management sub-state, the plurality of power management states including a first power management state, a second power management state, and a third power management state, the second power management state including a first sub-state;
        circuitry configured to, from the first power management state:
            determine whether an entry condition for the third power management state is satisfied;
            if the entry condition for the third power management state is satisfied, enter the third power management state;
            if the entry condition for the third power management state is not satisfied, determine whether an entry condition for the first sub-state is satisfied; and
            if the entry condition for the first sub-state is determined to be satisfied, enter the first sub-state, start a first sub-state residency timer, and after expiry of the first sub-state residency timer, exit the first sub-state, reenter the first power management state, and re-determine whether the entry condition for the third power management state is satisfied.

2. The computer processing device of claim 1, further comprising circuitry configured to, if the entry condition for the first sub-state is satisfied, prior to entering the first sub-state, start a pre-entry timer, re-determine whether the entry condition for the first sub-state is satisfied after expiry of the pre-entry timer, enter the first sub-state if the entry condition for the first sub-state is re-determined to be satisfied, and return to the first power management state if the entry condition for the first sub-state is not re-determined to be satisfied.

3. The computer processing device of claim 1, further comprising circuitry configured to, if the entry condition for the third power management state is satisfied, prior to entering the third power management state, start a pre-entry timer, re-determine whether the entry condition for the first sub-state is satisfied after expiry of the pre-entry timer, enter the third power management state if the entry condition for the third power management state is re-determined to be satisfied, and return to the first power management state if the entry condition for the third power management is not re-determined to be satisfied.

4. The computer processing device of claim 1, further comprising circuitry configured to, if the entry condition for the third power management state is satisfied, prior to entering the third power management state, start a pre-entry timer, re-determine whether the entry condition for the first sub-state is satisfied after either expiry of the pre-entry timer or receiving a message from an operating system, enter the third power management state if the entry condition for the third power management state is re-determined to be satisfied, and return to the first power management state if the entry condition for the third power management is not re-determined to be satisfied.

5. The computer processing device of claim 1, wherein the second power management state includes a second sub-state, and further comprising circuitry configured to:
    if the entry condition for the first sub-state is determined not to be satisfied, determine whether an entry condition for the second sub-state is satisfied; and
    if the entry condition for the second sub-state is determined to be satisfied, enter the second sub-state, start a second sub-state residency timer, and after expiry of the second sub-state residency timer, exit the second sub-state, reenter the first power management state, and re-determine whether the entry condition for the third power management state is satisfied.

6. The computer processing device of claim 1, wherein an exit latency of the third power management state is greater than an exit latency of the first sub-state.

7. The computer processing device of claim 1, wherein the first power management state is an S0i1 state, the second power management state is an S0i2 state, and the third power management state is an S0i3 state.

8. The computer processing device of claim 5, further comprising circuitry configured to, if the entry condition for the second sub-state is satisfied, prior to entering the second sub-state, start a pre-entry timer, re-determine whether the entry condition for the second sub-state is satisfied after expiry of the pre-entry timer, enter the second sub-state if the entry condition for the first sub-state is re-determined to be satisfied, and return to the first state if the entry condition for the second sub-state is not re-determined to be satisfied.

9. The computer processing device of claim 5, wherein an exit latency of the first sub-state is greater than an exit latency of the second sub-state.

10. The computer processing device of claim 5, wherein the first sub-state specifies a value for a retention voltage or a frequency, and the second sub-state specifies a higher value for the retention voltage or frequency.

11. A method for power management in a computer processing device, the method comprising:
- transitioning among a plurality of power management states and at least one power management sub-state, the plurality of power management states including a first power management state, a second power management state, and a third power management state, the second power management state including a first sub-state;
- from the first power management state:
  - determining whether an entry condition for the third power management state is satisfied;
  - if the entry condition for the third power management state is satisfied, entering the third power management state;
  - if the entry condition for the third power management state is not satisfied, determining whether an entry condition for the first sub-state is satisfied; and
  - if the entry condition for the first sub-state is determined to be satisfied, entering the first sub-state, starting a first sub-state residency timer, and after expiry of the first sub-state residency timer, exiting the first sub-state, reentering the first power management state, and re-determining whether the entry condition for the third power management state is satisfied.

12. The method of claim 11, further comprising, if the entry condition for the first sub-state is satisfied, prior to entering the first sub-state, starting a pre-entry timer, re-determining whether the entry condition for the first sub-state is satisfied after expiry of the pre-entry timer, entering the first sub-state if the entry condition for the first sub-state is re-determined to be satisfied, and returning to the first power management state if the entry condition for the first sub-state is not re-determined to be satisfied.

13. The method of claim 11, further comprising, if the entry condition for the third power management state is satisfied, prior to entering the third power management state, starting a pre-entry timer, re-determining whether the entry condition for the first sub-state is satisfied after expiry of the pre-entry timer, entering the third power management state if the entry condition for the third power management state is re-determined to be satisfied, and returning to the first power management state if the entry condition for the third power management is not re-determined to be satisfied.

14. The method of claim 11, further comprising, if the entry condition for the third power management state is satisfied, prior to entering the third power management state, starting a pre-entry timer, re-determining whether the entry condition for the first sub-state is satisfied after either expiry of the pre-entry timer or receiving a message from an operating system, entering the third power management state if the entry condition for the third power management state is re-determined to be satisfied, and returning to the first power management state if the entry condition for the third power management is not re-determined to be satisfied.

15. The method of claim 11, wherein the second power management state includes a second sub-state;
- if the entry condition for the first sub-state is determined not to be satisfied, determining whether an entry condition for the second sub-state is satisfied; and
- if the entry condition for the second sub-state is determined to be satisfied, entering the second sub-state, starting a second sub-state residency timer, and after expiry of the second sub-state residency timer, exiting the second sub-state, reentering the first power management state, and re-determining whether the entry condition for the third power management state is satisfied.

16. The method of claim 11, wherein an exit latency of the third power management state is greater than an exit latency of the first sub-state.

17. The method claim 11, wherein the first power management state is an S0i1 state, the second power management state is an S0i2 state, and the third power management state is an S0i3 state.

18. The method of claim 15, further comprising, if the entry condition for the second sub-state is satisfied, prior to entering the second sub-state, starting a pre-entry timer, re-determining whether the entry condition for the second sub-state is satisfied after expiry of the pre-entry timer, entering the second sub-state if the entry condition for the first sub-state is re-determined to be satisfied, and returning to the first state if the entry condition for the second sub-state is not re-determined to be satisfied.

19. The method of claim 15, wherein an exit latency of the first sub-state is greater than an exit latency of the second sub-state.

20. The method of claim 15, wherein the first sub-state specifies a value for a retention voltage or a frequency, and the second sub-state specifies a higher value for the retention voltage or frequency.

* * * * *